United States Patent
Park et al.

(10) Patent No.: US 8,904,248 B2
(45) Date of Patent: Dec. 2, 2014

(54) NOISE REJECTION FOR BUILT-IN SELF-TEST WITH LOOPBACK

(75) Inventors: Brian S. Park, San Diego, CA (US); Gregory S. Scott, Santa Clara, CA (US); Anh T. Hoang, Fremont, CA (US)

(73) Assignee: Apple Inc., Cupertino, CA (US)

( * ) Notice: Subject to any disclaimer, the term of this patent is extended or adjusted under 35 U.S.C. 154(b) by 182 days.

(21) Appl. No.: 13/545,316

(22) Filed: Jul. 10, 2012

(65) Prior Publication Data

US 2014/0019817 A1    Jan. 16, 2014

(51) Int. Cl.
G01R 31/28    (2006.01)
G01R 31/317    (2006.01)
G11C 29/12    (2006.01)
G01R 31/3181    (2006.01)

(52) U.S. Cl.
CPC .......... *G01R 31/31716* (2013.01); *G11C 29/12* (2013.01); *G01R 31/31816* (2013.01)
USPC ........................................ 714/716

(58) Field of Classification Search
CPC ............. G01R 31/31724; G01R 31/31816; G01R 31/31716; G06F 11/27; G06F 11/2273; G11C 29/12
USPC ......... 714/37, 712, 724, 733, 738, 824, 716, 714/718, 754; 375/219, 221, 224, 227; 370/247, 249
See application file for complete search history.

(56) References Cited

U.S. PATENT DOCUMENTS

| | | | |
|---|---|---|---|
| 6,914,884 B2* | 7/2005 | Matsuo et al. | 370/249 |
| 7,477,875 B2* | 1/2009 | Zhang et al. | 455/67.11 |
| 7,539,242 B2* | 5/2009 | Yoshioka | 375/219 |
| 7,992,058 B2 | 8/2011 | Maroni et al. | |
| 8,086,915 B2 | 12/2011 | Bodrozic et al. | |
| 2007/0104111 A1 | 5/2007 | Kakizawa | |
| 2012/0017118 A1 | 1/2012 | Barakat et al. | |

OTHER PUBLICATIONS

Dabrowski et al.,m Built-in loopback test for IC RF transceivers, Jun. 2010, IEEE Trans., on Very Large Scale Integration Sys., vol. 18, No. 6, p. 933 to 946.*

* cited by examiner

*Primary Examiner* — Shelly A Chase
(74) *Attorney, Agent, or Firm* — Meyertons, Hood, Kivlin, Kowert & Goetzel, P.C.; Erik A. Heter

(57) ABSTRACT

A self-test loopback apparatus for an interface is disclosed. In one embodiment, a bidirectional interface of an integrated circuit includes a transmitter coupled to an external pin, a first receiver coupled to the external pin, and a second receiver coupled to the external pin. During operation in a test mode, the first receiver may be disabled. The transmitter may transmit test patterns generated by a built-in self-test (BIST) circuit, and compare those test patterns to patterns received by the second receiver. The second receiver may be implemented as a Schmitt trigger (wherein the first receiver may be a standard single-bit comparator). When operating in functional mode, the second receiver may be disabled.

23 Claims, 5 Drawing Sheets

NOISE REJECTION FOR BUILT-IN SELF-TEST WITH LOOPBACK

BACKGROUND

1. Technical Field

This disclosure is directed to electronic systems, and more particularly, to loopback testing of interfaces.

2. Description of the Related Art

For many electronic systems and devices, the manufacturing process concludes with one or more types of tests to ensure proper functionality and operation within specified limits. The types of testing that may be conducted are wide and varying, and may be suited to the particular system/device. Furthermore, testing may in some cases be conducted by external equipment, such as an integrated circuit test system, while in other cases self-tests may be conducted. In the latter case, integrated circuits and/or electronic systems may include one or more mechanisms built in for the conduct of such self-tests, commonly referred to as BIST, or built-in self-test. BISTs may be combined with other types of tests.

One type of test that a BIST may be used with is a loopback test. Loopback tests may be used to test interfaces to integrated circuits or electronic systems. To implement a loopback test, one or more transmitters configured to transmit data from the interface may be coupled to corresponding receivers of the same interface. Signals transmitted on the interface may "loop back" to the receiver for subsequent analysis to determine if the interface is functioning correctly.

SUMMARY

A self-test loopback apparatus for an interface is disclosed. In one embodiment, a bidirectional interface of an integrated circuit includes a transmitter coupled to an external pin, a first receiver coupled to the external pin, and a second receiver coupled to the external pin (thereby forming a loopback path between the transmitter and each of the receivers). During operation in a test mode, the transmitter may transmit test patterns generated by a built-in self-test (BIST) circuit, and compare those test patterns to patterns received by the second receiver. The second receiver may be implemented as a Schmitt trigger. When operating in functional mode, the second receiver may be disabled.

In one embodiment, a method includes a pattern generator of a BIST circuit generating test patterns. The test patterns may be provided to a transmitter, where there are transmitted directly to the second receiver. The second receiver may output received patterns to a comparison circuit configured to compare received patterns to corresponding test patterns generated by the pattern generator. If a received pattern does not match the corresponding test pattern, the BIST circuit may generate an indication that a test has failed. Otherwise, if the received pattern matches the corresponding test pattern, the BIST circuit may generate an indication that the test has passed.

As noted above, the second receiver may be implemented as a Schmitt trigger. Furthermore, the first receiver may be implemented as a comparator configured to compare a received signal to a reference voltage. Since testing of the interface may be conducted without the interface being coupled to other circuitry (e.g., a memory interface being tested while not coupled to memory), the signal path between the transmitter and the receivers may be subject to reflections that can lead to glitches and erroneous logic value interpretations by the first receiver. Accordingly, the second receiver is provided as a Schmitt trigger for such tests, since the inherent hysteresis may eliminate glitches.

BRIEF DESCRIPTION OF THE DRAWINGS

The following detailed description makes reference to the accompanying drawings, which are now briefly described.

Figure 1:
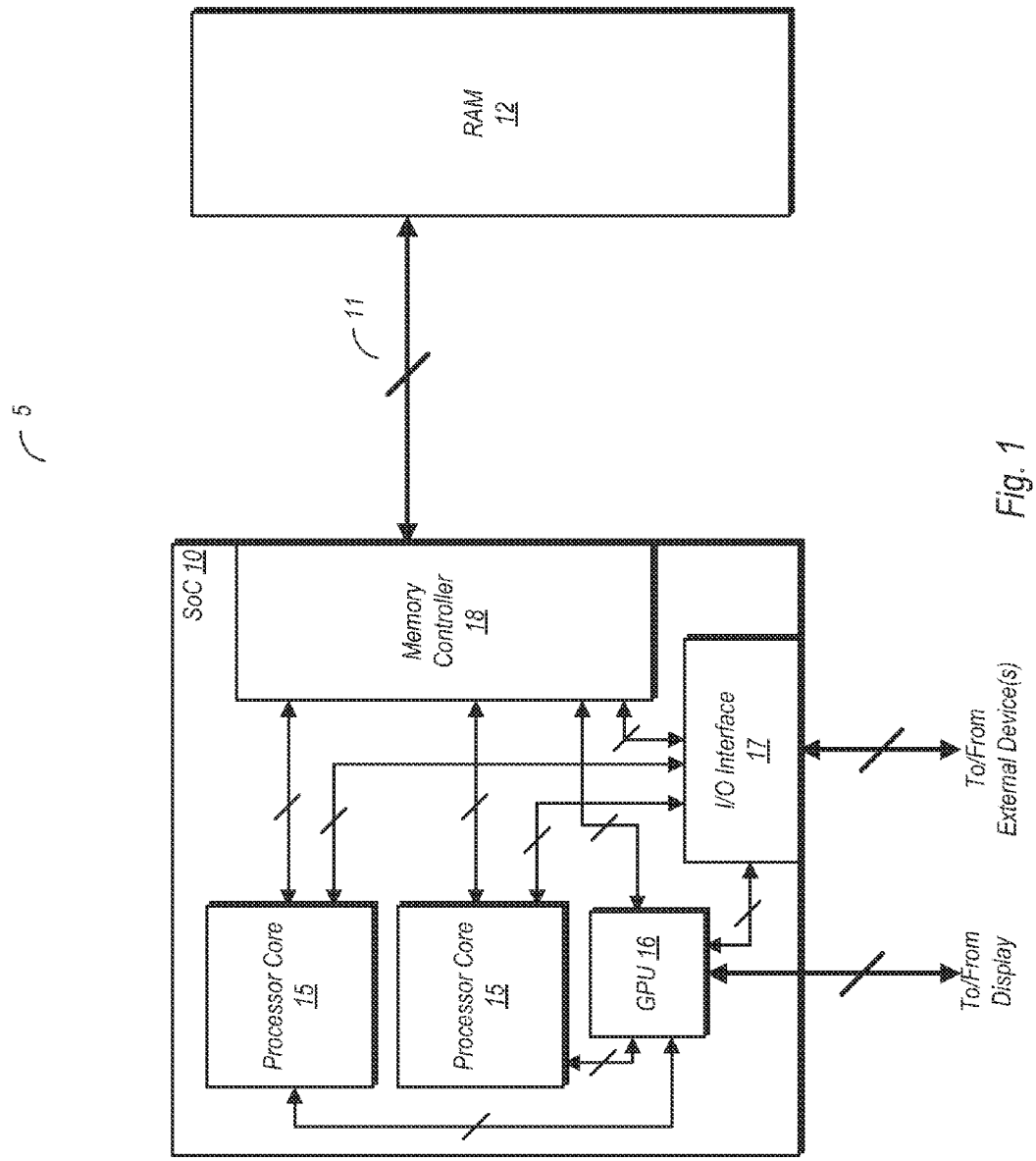
FIG. 1 is a block diagram of one embodiment of a computer system including a system on a chip (SoC) having a memory interface and a memory.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of a computer system including a system-on-a-chip (SoC) and a memory is shown. In the embodiment shown, computer system 5 includes SoC 10 and random access memory (RAM) 12. Although not explicitly shown, computer system 5 may also include other units, such as a display and one or more external devices. The term computer system 5 may be broadly applied, including desktop and laptop computers, tablet computers, various types of cellular phones including smart phones, and numerous other systems not explicitly mentioned here.

SoC 10 in the embodiment shown is a integrated circuit including two processor cores 15, a graphic processing unit (GPU) 16, and input/output (I/O) interface 17, and a memory controller 18.

Processor cores 15 may, among other functions, execute instructions for various software programs that may operate on computer system 5. Instructions and data for such software programs may be accessed from RAM 12 through memory controller 18, among other places. Furthermore, processor cores 15 may write data to RAM 12 through memory controller.

I/O interface 17 in the embodiment shown may be coupled to one or more additional devices that are either included in computer system 5 or are peripheral devices thereto. Such devices may include, but are not limited to, wireless communications devices (e.g., radio transceivers for cellular or wi-fi communications), printers, bulk storage devices (e.g., flash memories, hard disk storage, etc.), touch screens, keyboards, and so on. Multiple devices may be coupled to SoC 10 through I/O interface 17. Furthermore, I/O interface 17 in the embodiment shown is coupled to each of processor cores 15, to memory controller 18, and to GPU 16.

GPU 16 in the embodiment shown may process data to generate text and graphics displayed on a display device, such as a monitor or a touch screen. Information may be received by GPU 16 from either of processor cores 15, from another device through I/O interface 17, or from RAM 12 via memory controller 18.

Each of processor cores 15, GPU 16, and I/O interface 17 are coupled to memory controller 18 to enable access to RAM 12, which may serve as a general purpose memory for computer system 5. Accesses to RAM 12 may include read accesses, in which information is received from RAM 12, and write accesses, wherein information is written to RAM 12. Memory controller 18 in the embodiment shown is coupled to RAM 12 by a bi-directional bus 11. The bi-directional bus 11 may include a number of bi-directional signal lines. Accordingly, memory controller may include a physical interface that includes a number of transceivers that are configured to transmit and receive signals over the bi-directional signal lines when SoC 10 is implemented in a system.

Prior to implementing SoC 10 in a system, testing may be required. One test may include determining the functionality of the physical interface of memory controller 18. During such testing, RAM 12 may not be connected. Testing may be conducted using a loopback. Each transceiver may include a transmitter and a receiver coupled to a common signal pin or I/O pad. Thus, the performed test may be a loopback test in which signals are transmitted directly from a transmitter output to a receiver input, with the transmitted test pattern being compared to the received test pattern to ensure integrity of the transceiver. However, the termination of the loopback path may be different when RAM 12 is not connected relative to when SoC 10 is implemented computer system 10 and fully connected to RAM 12. This in turn can cause false failures in conducting a test of the physical interface. Accordingly, the transceivers used to implement the physical interface of memory controller 18 may utilize and alternate arrangement to alleviate this problem.

Figure 2:
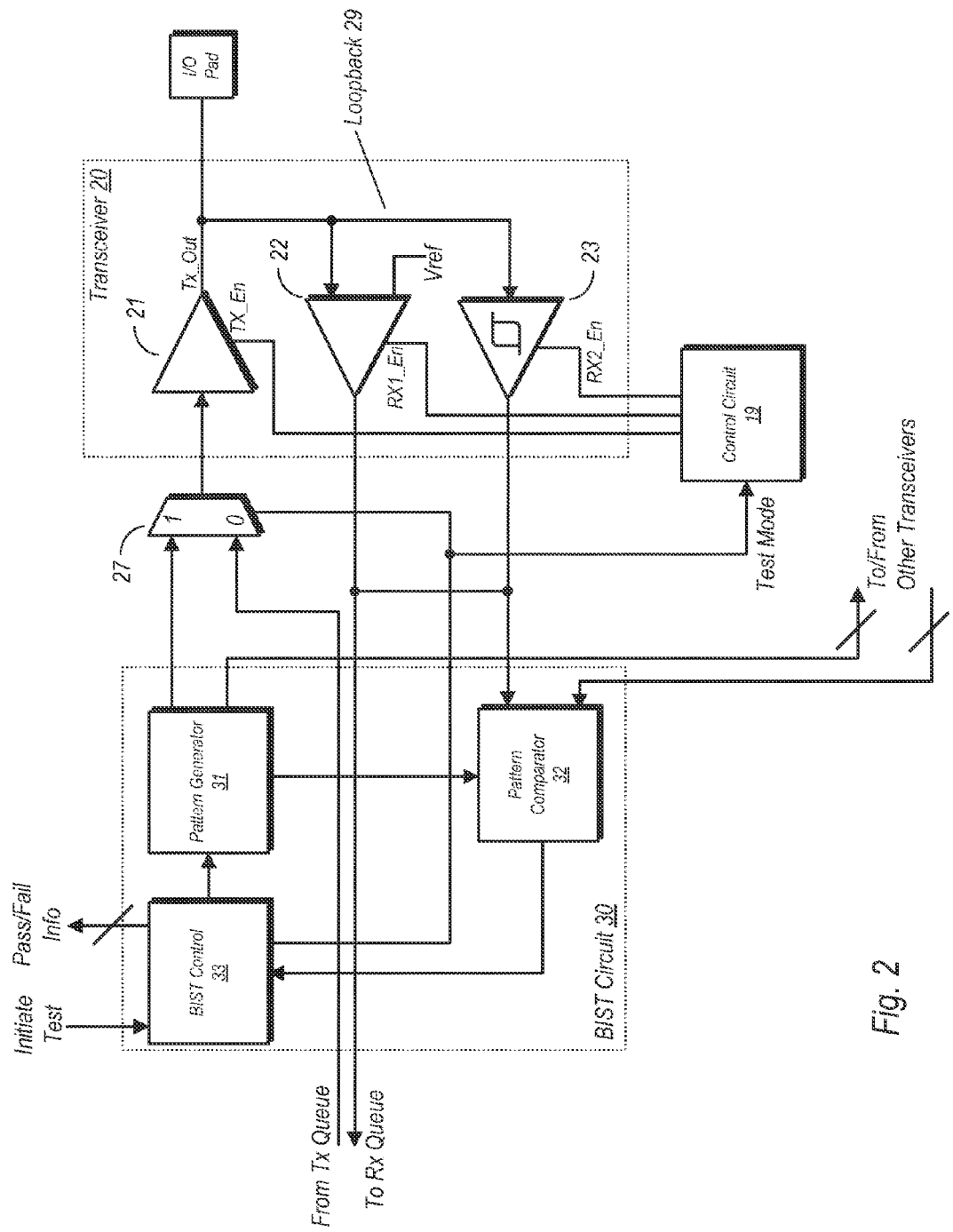
FIG. 2 is a block diagram of a portion of one embodiment of a memory interface including a built-in self-test (BIST) circuit.

FIG. 2 is a block diagram illustrating is a block diagram of a portion of one embodiment of a memory interface including a built-in self-test (BIST) circuit. In the embodiment shown, transceiver 20 is one of a number of transceivers implemented in the physical interface of memory controller 18 as discussed above. Embodiments of transceiver 20 implemented in other types of interfaces are possible and contemplated. Testing of the transceivers in memory interface 18 may be conducted by a built-in self-test (BIST) circuit 30, which may generate test patterns and may compare transmitted test patterns to received test patterns.

Transceiver 20 (as well as other instances thereof not shown in FIG. 2) includes a transmitter 21, a first receiver 22, and a second receiver 23. Receiver 22 may be used to receive signals during operation in normal (functional) mode, while receiver 23 may be used to receive signals during operation in a test mode. The output of transmitter 21, receiver 22, and receiver 23 are each coupled, via loopback node 29, to an I/O pad or I/O pin of the integrated circuit in which they are implemented. This arrangement may enable loopback testing under the control of BIST circuit 30.

Transmitter 21 in the embodiment shown may receive logic signals to be transmitted from multiplexer 27. A first input of multiplexer 27 is coupled to a transmitter queue (not shown) in memory controller 18. During operation in the normal mode, this input may be selected by the multiplexer. When operating in the test mode, multiplexer 21 may select the input coupled to pattern generator 31 of BIST circuit 30. Test patterns (i.e. various sequences of logic 0's and logic 1's) may be generated and provided to transmitter 21 for transmission on loopback 29.

Receiver 22 may be implemented as a comparator circuit configured to compare a voltage level of an incoming signal to a reference voltage level in order to determine whether a logic 0 or a logic 1 has been received. The result of each comparison by receiver 22 may be conveyed to a receive queue (not shown) in memory controller 18.

During operation in the normal mode, when RAM 12 is coupled to memory controller 18, the signal path between RAM 12 and transceiver 20 may be terminated such that reflections and other noise that could cause erroneous readings is largely minimized. Accordingly, a simple comparator that does not require any significant hysteresis in its operation may be used to implement receiver 22.

In contrast, when operating in the test mode with RAM 12 not connected to memory controller 18, reflections and other noise that could cause erroneous readings by receiver 22 may be present. Accordingly, a second receiver 23 may be implemented for use during operation in the test mode. Receiver 23 in the embodiment shown is implemented as a Schmitt trigger. Schmitt triggers are well known in the art, and are implemented using positive feedback. A Schmitt trigger provides the effect of hysteresis, in which the state of the output depends both on the present input voltage as well as the recent history of the input voltage. Accordingly, a Schmitt trigger is more likely to reject small voltage spikes (upward or downward) on loopback 29 as being valid transitions. It is noted that while a Schmitt trigger is used to implement the second receiver in the embodiments discussed herein, embodiments using other types of circuits having the hysteresis effect are possible and contemplated.

In one embodiment, operation in the test mode may include disabling the first receiver 22 and enabling the second receiver 23. Test patterns may be transmitted by transmitter 21 onto loopback 29. These test patterns may be received and evaluated by receiver 23. The output of receiver 23 may be received by pattern comparator 32 of BIST circuit 30, which is discussed in further detail below.

It is noted that in the embodiment shown, the output of receiver 22 is coupled to the output of receiver 23 by a wired-OR connection. Accordingly, similar testing may be conducted with first receiver 22 enabled and second receiver 23 disabled. However, due to various noise sources present on loopback 29 during such testing, receiver 22 may erroneously interpret some received logic values. More particularly, since receiver 22 may evaluate incoming logic signals without significant hysteresis, noise present on loopback 29 may be interpreted as a signal transition, even though the transmitted test pattern does not include a corresponding transition. However, when second receiver 23 is used in lieu of first receiver 22 during operation in the test mode, the hysteresis of the Schmitt trigger may reject noise on loopback 29. Accordingly, the Schmitt trigger used to implement second receiver 23 may prevent glitches and other short-term noise phenomena as being erroneously interpreted as an intended signal transition.

Testing via loopback 29 may be conducted under the control of BIST circuit 30. In the embodiment shown, BIST circuit 30 includes BIST control unit 33, pattern generator 31, and pattern comparator 32. BIST control circuit 33 may initiate a self-test of transceiver 20 responsive to an initiation signal ('Initiate Test') that may be received from another functional unit or from a source external to the integrated circuit in which BIST circuit 30 is implemented. Responsive to initiation of the test, BIST control unit 33 may assert a signal indicating operation in the test mode ('Test Mode'). The test mode signal may be provided to multiplexer 27 to select the output of pattern generator 31 as the input to be provided to transmitter 21. Furthermore, the test mode signal may also be provided to control circuit 19. Control circuit 19 in the embodiment shown is configured to control the enabling and disabling of transmitter 21 and receivers 22 and 23. For at least some tests controlled by BIST circuit 30, control circuit may assert the enable signals provided to transmitter 21 and receiver 23, while de-asserting the enable signal provided to receiver 22. Thus, during this particular type of testing, transmitter 21 and receiver 23 may be enabled, while receiver 22 may be disabled.

Testing under the control of BIST circuit 30 may be conducted by transmitting test patterns from transmitter 21. The test patterns, which are various sequences of logic 1's and logic 0's, may be provided to transmitter 21 via multiplexer 27. The test patterns may also be provided to pattern comparator 32 to provide a basis for subsequent comparisons. The logic 0's and 1's of the test patterns may be transmitted directly from transmitter 21 to receiver 23 via loopback 29. Receiver 23 may in turn interpret the received logic values and provide results of these interpretations to pattern comparator 32. Pattern comparator 32 may compare the result output by receiver 23 to the test pattern transmitted by transmitter 21. A passing result may be recorded when a pattern output by receiver 23 matched a pattern transmitted by transmitter 21. A failing result may be recorded when a pattern output by receiver 23 does not match the pattern transmitted by transmitter 21. Recorded results may be forwarded from pattern comparator 32 to BIST control unit 33. In turn, BIST control unit 33 may provide pass/fail information for each of the transceivers tested, either during the conduct of the test or upon its completion.

When testing has completed, BIST control circuit 33 may de-assert the test mode signal. When the test mode signal is de-asserted, control circuit 19 may configure transceiver 20 for operation in the normal mode. More particularly, control circuit 19 may disable receiver 23 when operating in the normal mode. Transmitter 21 may be enabled during write operations, i.e. when data is being transferred from memory controller 18 to RAM 12. Receiver 22 may be disabled during write operations. During read operations, i.e. when data is being received by memory controller 18 from RAM 12, receiver 22 may be enabled, while transmitter 22 may be disabled.

Figure 3:
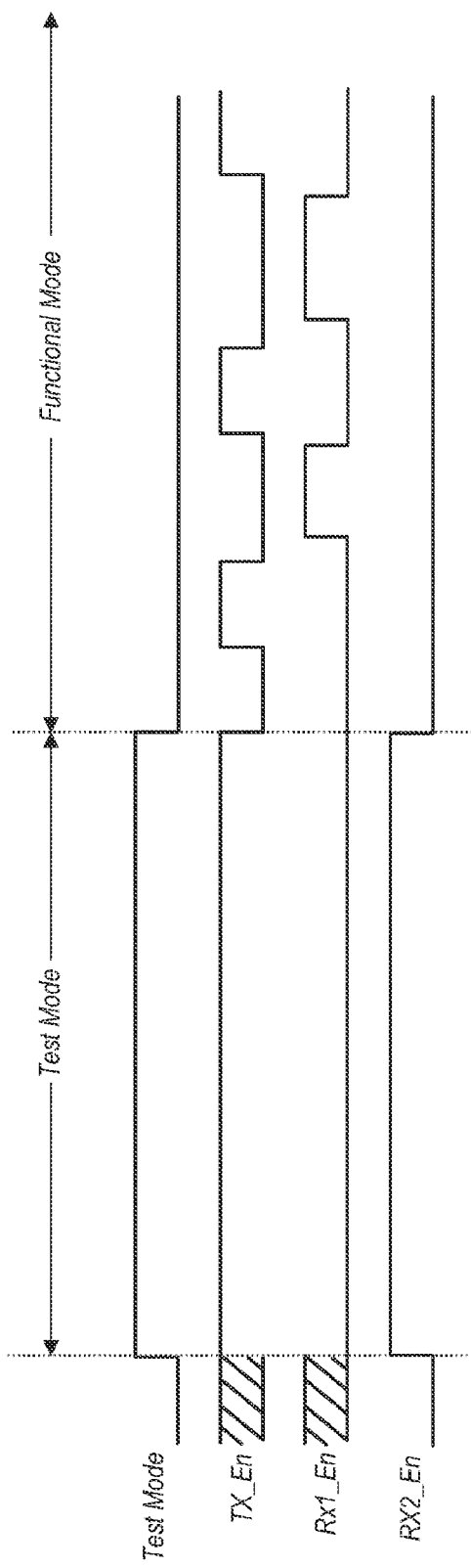
FIG. 3 is a timing diagram illustrating operation of a transceiver in a test mode and in a functional mode.

Turning now to FIG. 3, a timing diagram is shown illustrating operation of one embodiment of a transceiver circuit in test mode and in functional mode. The illustrated example may apply to transceiver 20 as shown above, or another embodiment not explicitly discussed herein.

Test mode may be entered by asserting the test mode signal. Responsive to asserting the test mode signal, respective enable signals for the transmitter ('TX_En') and the second receiver implemented as a Schmitt trigger ('RX2_En') may be asserted. The enable signal for the first receiver ('RX1_En') may be de-asserted. During this time, test patterns may be transmitted from the transmitter directly to the second receiver via the loopback.

Functional mode may be entered whenever the test mode signal is de-asserted. When the test mode signal is de-asserted, the enable signal provided to the second receiver may be maintained in a de-asserted state. The enable signal for the transmitter may be selectively asserted to transmit data during write operations, while being de-asserted when no write operations are occurring. Similarly, the enable signal for the first receiver may be selectively asserted to receive data during read operations, and may otherwise be de-asserted.

Figure 4:
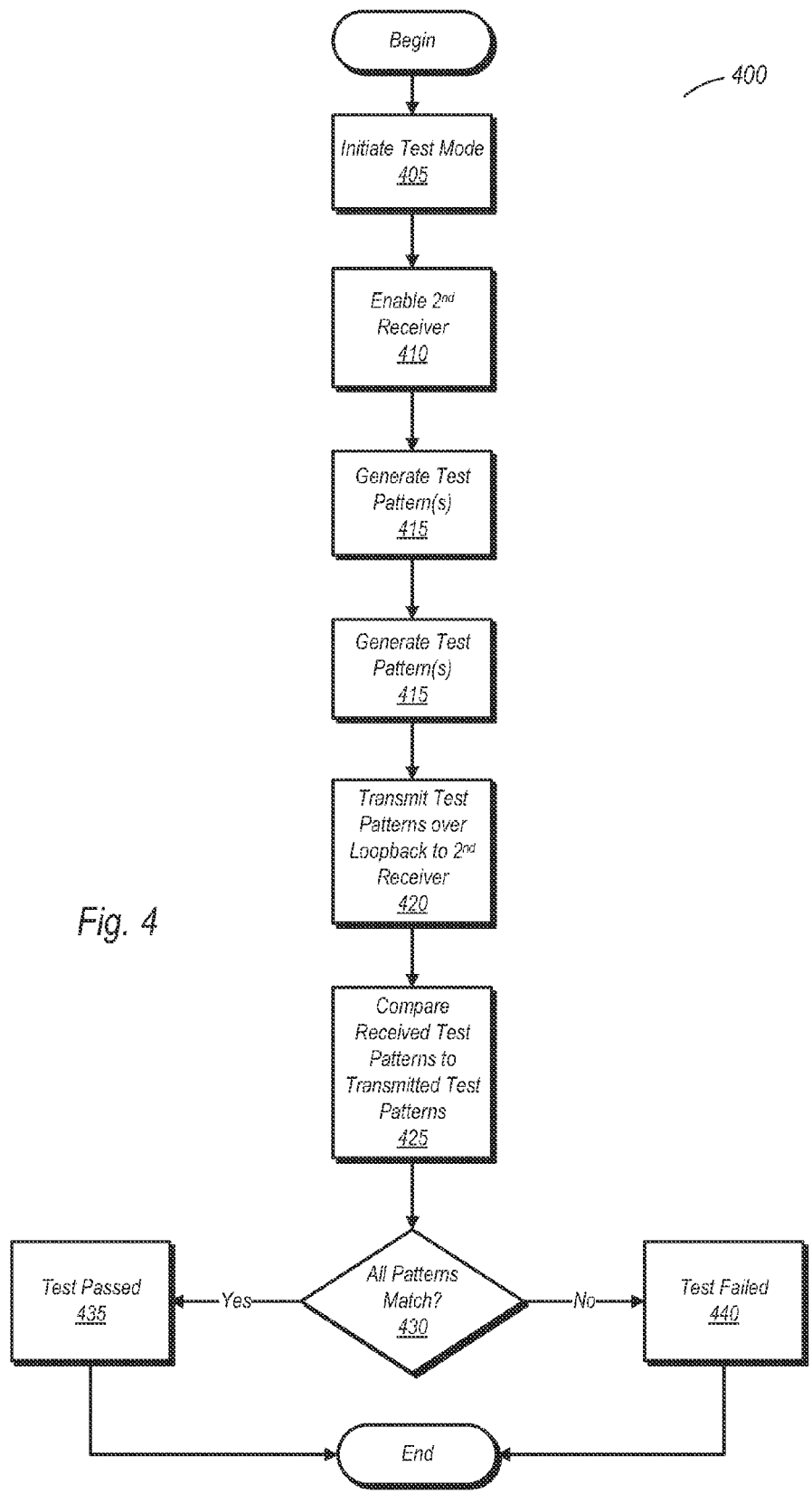
FIG. 4 is a flow diagram of one embodiment of a method for conducting BIST through a loopback of an interface.

FIG. 4 is a flow diagram of one embodiment of a method for conducting BIST through a loopback of an interface. Method 700 as described herein may be implemented using various embodiments of the circuitry discussed above. Other circuitry not explicitly discussed herein may also be capable of implementing method 700.

Method 700 begins with the initiation of a test mode (block 705). Responsive to initiation of the test mode, a second receiver may be enabled (block 710). Enabling of the second receiver may also be performed in conjunction with the enabling of a transmitter and the disabling of a first receiver that is used during normal operations.

In order to perform the test, test patterns may be generated (block 715). The test patterns may be various sequences of logic 1's and logic 0's. The test patterns may be transmitted by a transmitter, over a loopback, directly to the second receiver (block 420). The transmissions from the transmitter may be evaluated by the receiver with the evaluation results being passed to a comparator. The comparator may compare the transmitted patterns with those received by the second receiver (block 425). If all of the patterns received by the second receiver match corresponding ones transmitted by the transmitter (block 430, yes), then the test is considered to have passed (block 435). If one or more patterns received by the second receiver do not match corresponding ones transmitted by the transmitter, the test is considered to have failed (block 440).

While the discussion above has been presented in terms of a memory interface, it is noted that the disclosure herein is not so limited. The general type of interface described above and the corresponding method of testing may be applied to a wide variety of interfaces that are suitable for loopback testing.

Figure 5:
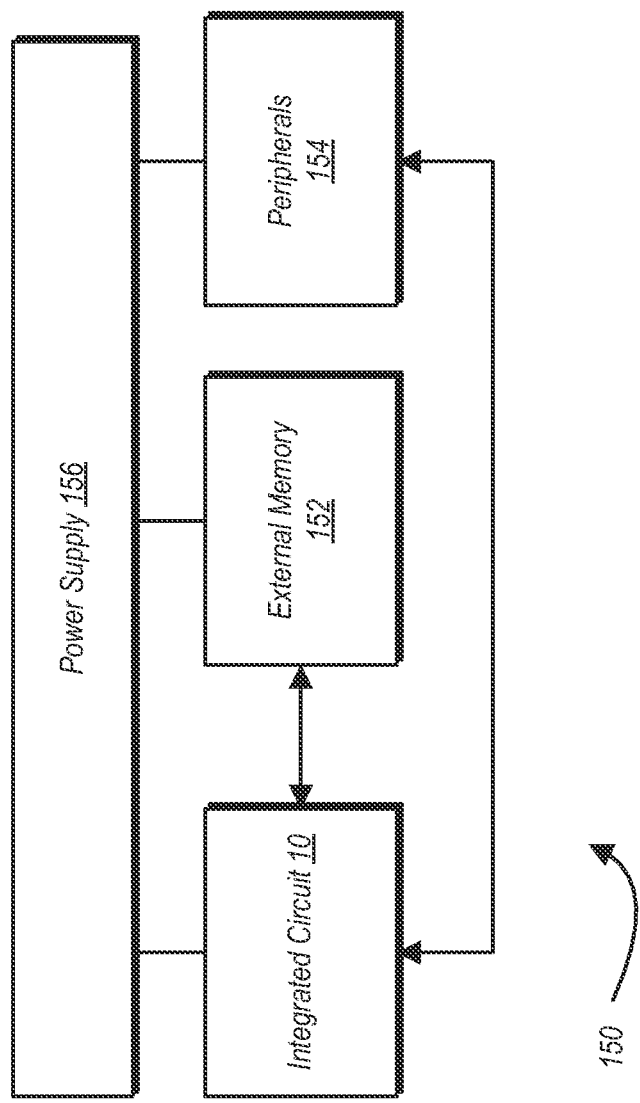
FIG. 5 is a block diagram of one embodiment of a system.

Turning next to FIG. 5, a block diagram of one embodiment of a system 150 is shown. In the illustrated embodiment, the system 150 includes at least one instance of an IC 5 (e.g., that implements SoC 10 of FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
 first receiver coupled to receive signals from an interface;
 a second receiver coupled to receive signals from the interface;
 a built-in self-test (BIST) circuit coupled to the second receiver, wherein the BIST circuit is configured to, when operating in a test mode, receive signals from the second receiver and disable the first receiver; and
 a control circuit configured to, when operating in a non-test mode, disable the second receiver, and wherein the first receiver is configured to receive signals when operating in the non-test mode.

2. The apparatus as recited in claim 1, wherein the second receiver includes a Schmitt trigger.

3. The apparatus as recited in claim 1, further comprising a transmitter coupled to the BIST circuit, wherein the BIST circuit includes a pattern generator configured to generate signal patterns to be transmitted by the transmitter when operating in the test mode, and wherein an output of the transmitter is coupled to an input of the second receiver when operating in the test mode.

4. The apparatus as recited in claim 1, wherein the BIST circuit includes a pattern comparator coupled to an output of the second receiver, wherein the pattern comparator is configured to compare patterns received by the second receiver to patterns transmitted from the transmitter.

5. A method comprising:
 receiving signals transmitted on an interface at a first receiver when operating in a functional mode;
 receiving the signals transmitted on the interface at a second receiver when operating in a test mode;
 disabling the first receiver when operating in the test mode; and
 providing the signals transmitted on the interface to a built-in self-test (BIST) circuit when operating in the test mode;
 wherein the second receiver is a Schmitt trigger, and wherein the method further comprises the BIST circuit disabling the second receiver when operating in the functional mode.

6. The method as recited in claim 5, further comprising:
 generating, using a pattern generator, first signal patterns to be transmitted by a transmitter to the second receiver via a loopback connection; and
 receiving second signal patterns at the second receiver.

7. The method as recited in claim 6, further comprising comparing the first signal patterns to the second signal patterns, wherein said comparing is performed by a comparator circuit coupled to an output of the second receiver.

8. The method as recited in claim 5, further comprising disabling the second receiver when operating in the functional mode.

9. An integrated circuit comprising:
 an interface unit configured to couple a functional unit internal to the integrated circuit to circuitry external to the integrated circuit, wherein the interface unit includes:
  a first receiver configured to, during operation in a functional mode receive signals from an external pin of the integrated circuit;
  a second receiver coupled to the external pin and configured to, during operation in a test mode, receive signals from a transmitter in the integrated circuit; and
  a test circuit configured to, during operation in the test mode, disable the first receiver and to receive signals from the second receiver, wherein the second receiver includes a Schmitt trigger.

10. The integrated circuit as recited in claim 9, wherein an output of the transmitter, and input of the first receiver, and an input of the second receiver are each coupled to the external pin.

11. The integrated circuit as recited in claim 9, wherein the test circuit is configured to generate test stimulus patterns to be transmitted by the transmitter during operation in the test mode.

12. The integrated circuit as recited in claim 11, wherein the test circuit is configured to receive test result patterns from the second receiver during operation in the test mode, and further configured to compare the test result patterns to the test stimulus patterns.

13. The integrated circuit as recited in claim 9, further comprising a control circuit configured to, when operating in the first mode, disable the first receiver when the transmitter is transmitting signals and further configured to enable the receiver when the transmitter is not transmitting signals.

14. A method comprising:
 disabling a first receiver having an input coupled to an external pin of an integrated circuit in which the first receiver is implemented;
 enabling a second receiver having an input coupled to the external pin, wherein the second receiver is implemented in the integrated circuit;
 transmitting, a first sequence of logic 0's and logic 1's from a transmitter in the integrated circuit, the transmitter having an output coupled to the external pin; and
 determining if a second sequence of logic 0's and logic 1's received by the second receiver match the first sequence.

15. The method as recited in claim 14, wherein the first receiver includes a single bit comparator, and wherein the second receiver includes a Schmitt trigger.

16. The method as recited in claim 15, further comprising:
 a test pattern comparison circuit generating a first indication if the second sequence does not match the first sequence; and
 the test pattern generator generating a second indication if the second sequence matches the first sequence.

17. The method as recited in claim 14, further comprising entering an operational mode, wherein entering the operational mode includes disabling the second receiver and enabling the first receiver when the transmitter is not transmitting signals.

18. The method as recited in claim 14, further comprising a test pattern generation circuit generating the first sequence.

19. A memory interface comprising:
   a plurality of bi-directional transceivers, wherein each of the bi-directional transceivers includes:
      a transmitter having an output coupled to an external pin of a integrated circuit in which the memory interface is implemented;
      a first receiver having an input coupled to the external pin; and
      a second receiver having an input coupled to the external pin; and
   a test circuit, wherein the test circuit is configured to, during operation in a test mode, disable the first receiver and enable the second receiver.

20. The memory interface as recited in claim 19, further comprising a control circuit configured to disable the second receiver when not operating in the test mode.

21. The memory interface as recited in claim 19, wherein the first receiver is configured to compare a received signal to a reference voltage, and wherein the second receiver includes a Schmitt trigger.

22. The memory interface as recited in claim 19, further comprising control circuit configured to, during operation in a functional mode, disable the first receiver when the transmitter is transmitting signals, and further configured to enable the first receiver when the transmitter is not transmitting signals.

23. The memory interface as recited in claim 19, wherein the test circuit includes test pattern generation circuitry configured to provide test patterns to the transmitter, and comparison circuitry configured to compare patterns of signals received by the receiver to test patterns provided to the transmitter, and further configured to provide indications when a pattern received by the receiver does not match a corresponding test pattern provided to the transmitter.

* * * * *